(12) United States Patent
Johnson et al.

(10) Patent No.: US 6,179,448 B1
(45) Date of Patent: Jan. 30, 2001

(54) AUTOMATED LIGHT TUNER

(75) Inventors: David R. Johnson, Meridian; Peter S. Frank; Joe L. Phillips, both of Nampa; Robert J. Hatfield, Boise, all of ID (US)

(73) Assignee: Micron Technology, Inc., Boise, ID (US)

(*) Notice: Under 35 U.S.C. 154(b), the term of this patent shall be extended for 0 days.

(21) Appl. No.: 09/025,213

(22) Filed: Feb. 18, 1998

(51) Int. Cl.$^7$ .................................................. F21V 21/28
(52) U.S. Cl. ............................................ 362/285; 362/276
(58) Field of Search .................................. 362/276, 285, 362/286, 321, 383, 802, 275; 359/385, 389, 393, 390; 250/205

(56) References Cited

U.S. PATENT DOCUMENTS

| | | | |
|---|---|---|---|
| 3,639,751 | 2/1972 | Pichel | 362/294 |
| 3,648,045 | 3/1972 | Le Vantine et al. | 362/285 |
| 3,663,109 | 5/1972 | Sharples | 250/574 |
| 3,706,000 | 12/1972 | Retzer et al. | 313/156 |
| 3,953,726 * | 4/1976 | Scarritt | 362/286 |
| 3,992,089 | 11/1976 | Hirose et al. | 355/45 |
| 4,006,426 | 2/1977 | Lacour | 359/497 |
| 4,009,966 | 3/1977 | Craig | 356/122 |
| 4,021,031 | 5/1977 | Meihofer et al. | 242/563.1 |
| 4,069,415 | 1/1978 | Dacal | 362/263 |
| 4,173,398 | 11/1979 | Okamoto et al. | 351/214 |
| 4,192,583 | 3/1980 | Horton | 126/602 |
| 4,423,471 | 12/1983 | Gordin et al. | 362/218 |
| 4,464,707 | 8/1984 | Forrest | 362/221 |
| 4,466,739 | 8/1984 | Kasner et al. | 356/138 |
| 4,729,077 * | 3/1988 | Gordin | 362/285 |
| 4,820,911 | 4/1989 | Arackellian et al. | 235/462.39 |
| 4,841,946 | 6/1989 | Marks | 126/575 |
| 4,967,318 | 10/1990 | Ewert et al. | 362/287 |
| 4,992,695 | 2/1991 | Naum | 313/114 |
| 5,077,641 | 12/1991 | Schmidt et al. | 362/226 |
| 5,105,342 * | 4/1992 | Zillgitt | 362/286 |
| 5,138,542 | 8/1992 | Daumueller et al. | 362/428 |
| 5,299,100 | 3/1994 | Bellows et al. | 362/263 |
| 5,317,489 | 5/1994 | Delli Gatti et al. | 362/253 |
| 5,381,321 | 1/1995 | Fearing, Jr. et al. | 362/221 |
| 5,424,929 | 6/1995 | Murray et al. | 362/109 |
| 5,428,517 | 6/1995 | Behringer | 362/226 |
| 5,588,734 | 12/1996 | Talamo et al. | 362/249 |
| 5,700,084 * | 12/1997 | Yasukawa | 362/276 |

\* cited by examiner

*Primary Examiner*—Sandra O'Shea
*Assistant Examiner*—Hargobind Sawhney
(74) *Attorney, Agent, or Firm*—Dorsey & Whitney LLP

(57) ABSTRACT

An apparatus and method for automatically tuning the power and the intensity of light supplied to an illuminated object to some desired values, the apparatus including a light source positionable along at least a first axis with respect to a reflector, a drive assembly for positioning the light source in response to an intensity of light measured by a light meter positioned to sample light reflected from the object along a reflected light path, and a diaphragm having an adjustable aperture for controlling the amount of light supplied to the object. The light source is automatically positioned along the first axis to achieve a maximum intensity of light on the object. The light source may then be automatically positioned along a second axis and a third axis to achieve respective maximum light intensities on the object.

40 Claims, 5 Drawing Sheets

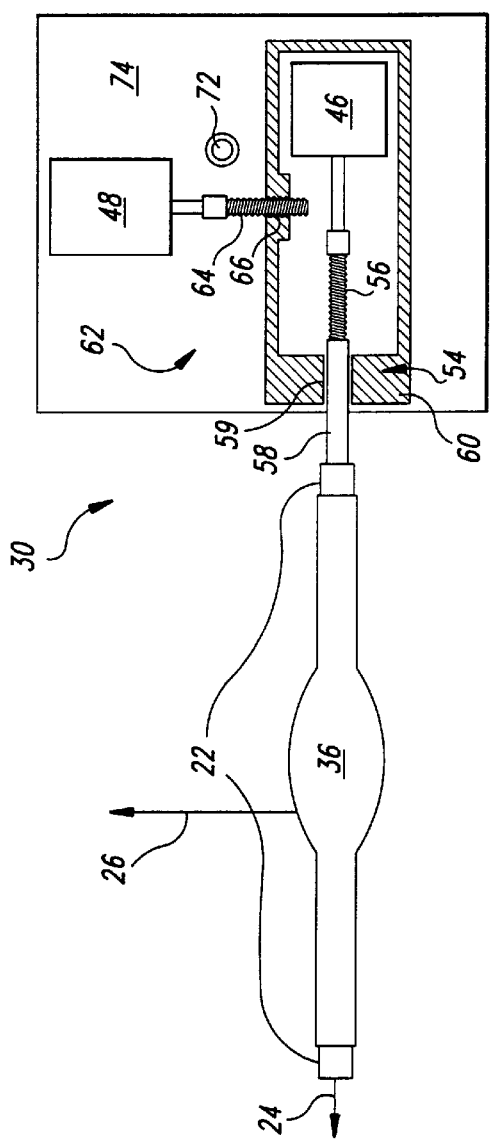
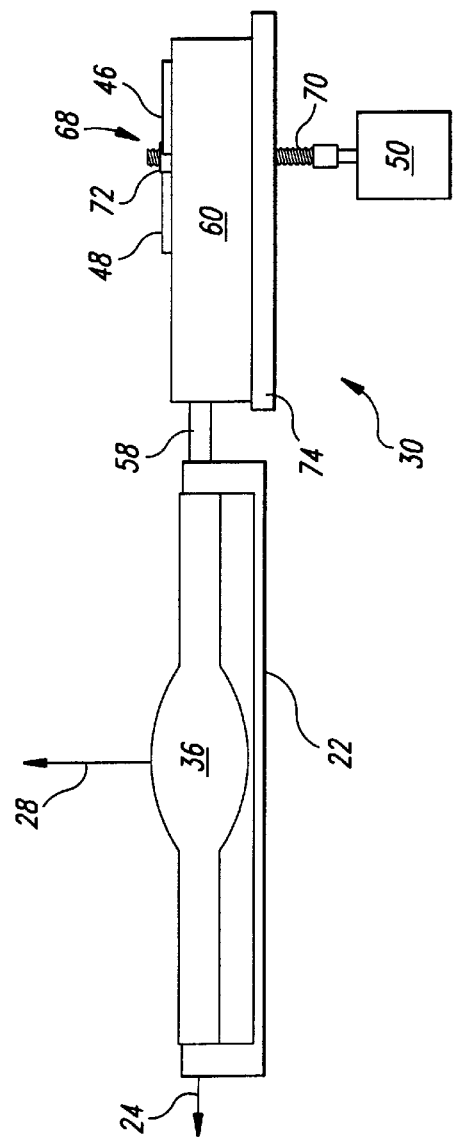

AUTOMATED LIGHT TUNER

TECHMCAL FIELD

This invention relates generally to the field of illumination systems, and more specifically to adjusting the intensity and power of light provided by illumination devices, particularly those for use with magnification systems, such as microscopes.

BACKGROUND OF THE INVENTION

Magnification systems require an illumination source for illuminating the object to be magnified. In many situations, the intensity of the light illuminating the object must be kept uniform over a significant duration of time for proper imaging. In certain fields, such as microelectronic fabrication, uniform light intensity is critical to properly inspect the surfaces of microelectronic devices. Uniformity in the light intensity on an illuminated object is difficult to achieve for any significant duration. For example, the amount of light emitted by an illumination source, such as a light bulb, may change as the light bulb heats up, ages, etc. This is especially true when a high intensity light source is employed. The intensity of light provided by a high intensity light source begins to change almost immediately upon operation. Even if the intensity of the light from the light source is constant, the intensity of light provided by an illumination device using the light source would still vary. For example, as components and structures in the illumination device heat up, the geometry of the components, including the relative position of the light source and reflector, varies thus altering the intensity of light provided by the illumination device. Therefore, to maintain a constant intensity of light on an illuminated object, the power and the intensity of light produced by the illumination device must continually be tuned to compensate for the various changes.

A manual method is currently employed to tune the intensity and amount of light provided by an illumination device. The position of the light source is manually adjusted by a technician in an attempt to maintain the intensity of illumination constant over time. The size of an aperture in a diaphragm is likewise, manually adjusted, in an attempt to maintain a constant amount of light per unit of time, or power. This requires a skilled technician to make many time-consuming and error prone adjustments to the correctly position of the light source.

SUMMARY OF THE INVETION

An automated light tuner is provided to reduce the time and level of skill required of technicians to adjust an illumination device to achieve a uniform intensity of light on an object, such as an object being magnified or illuminated over a period of time. The automated light tuner also eliminates the error introduced by the manual method of tuning. In a first exemplary embodiment, the automated light tuner includes a housing which defines an enclosure having an opening at one end. A reflector is mounted in the enclosure, and a light source mounted in a light source receiver is positioned in the enclosure between the reflector and the opening. The light source and reflector are selectively positionable with respect to one another along at least a first axis. Preferably, the light source is selectively positionable with respect to the reflector along a first axis, a second axis and a third axis. The automated light tuner also includes a light meter which is composed of a power meter and a sensor such as a photomultiplier tube, an avalanche diode, or a silicon diode, the sensor being positioned in a light reflection path. The power meter measures the amount of light per unit of time reflected from an object which, due to the fixed area of the sensor, is proportional to the intensity of light being delivered to the illuminated object. The power meter provides a measure of the amount of light, and consequentially the light intensity, to a control mechanism in the form of a power signal. The control mechanism responds to the power signal by producing a control signal for controlling a drive assembly that positions the light source relative to the reflector. The automated light tuner may further include a diaphragm having an aperture located across the opening of the enclosure. The aperture of the diaphragm is adjustable to limit the amount of light, or power, delivered to the target position. The drive assembly, diaphragm and light meter are coupled to each other in a feedback loop to adjust the amount and the intensity of light delivered to the object to a desired value, which may be constant.

The drive assembly may include a first motor, a second motor and a third motor for positioning the light source with respect to the reflector along the first axis, the second axis and the third axis, respectively. The motors may be connected to the light source receiver by a set of drive trains. The motors may be controlled by a motor controller, which may in turn be controlled by the control mechanism.

The aperture may be adjusted by an aperture drive mechanism which may include an aperture motor and an aperture motor controller. The aperture motor controller may in turn be controlled by the control mechanism.

The control mechanism can take the form of a hard wired circuit or microprocessor, but in the exemplary embodiment is shown as a programmed general purpose computer. The control mechanism receives the measurements of amount of light and the light intensity which are produced by the light meter. The control mechanism uses these measurements to incrementally adjust the position of the light source with respect to the reflector. The position of the light source with respect to the reflector is preferably first adjusted along the first axis to achieve a maximum intensity of light at the target position. The position of the light source with respect to the reflector may next be adjusted along the second axis to again achieve a maximum light intensity. The position of the light source with respect to the reflector can then be adjusted along the third axis to again achieve a maximum light intensity at the target position. A maximum intensity along any given axis may be reached by moving the light source in incremental steps along the given axis until the light intensity begins to fall off. The light source is then moved in the opposite direction along the same axis, using a smaller incremental step, until the intensity begins to fall off. This reiterative process is performed until some minimum incremental step is achieved, signifying that the maximum illumination has been reached with respect to the given axis. Alternatively, the light source may be moved with respect to the reflector until the intensity begins to fall off. The light source may then be incremented one or less steps in the opposite direction.

Once the maximum light intensity has been achieved for all of the desired axes, the aperture of the diaphragm may be adjusted until a desired amount of light is achieved at the target position. A reiterative procedure may be used to adjust the size of the aperture to achieve the desired amount of light in which the size of the aperture is first incrementally adjusted in a first direction until the desired amount of light is overstepped. The size of the aperture is then incrementally adjusted in the second direction in an incremental step smaller than the first incremental step until the desired amount of light is again overstepped. This process is performed until some minimum increment step size is reached.

In a second exemplary embodiment, a lens may be located between the light source and the diaphragm. The lens may be selectively positioned between the light source and the drive diaphragm by a lens position drive mechanism which includes a lens holder, lens positioning motor, and lens drive train. The lens positioning motor is controlled by the control mechanism. The lens is adjustable with respect to the reflector or the light source to achieve a desired light intensity at the target position.

BRIEF DESCRIPTION OF THE DRAWINGS

FIG. 4 is a top plan view of the drive assembly of the exemplary embodiment of FIG. 1.

FIG. 5 is a side elevational view of the drive assembly of FIG. 4.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known structures associated illumination devices for magnification systems have not been shown in detail in order to avoid unnecessarily obscuring the description of the embodiments of the invention.

Figure 1:
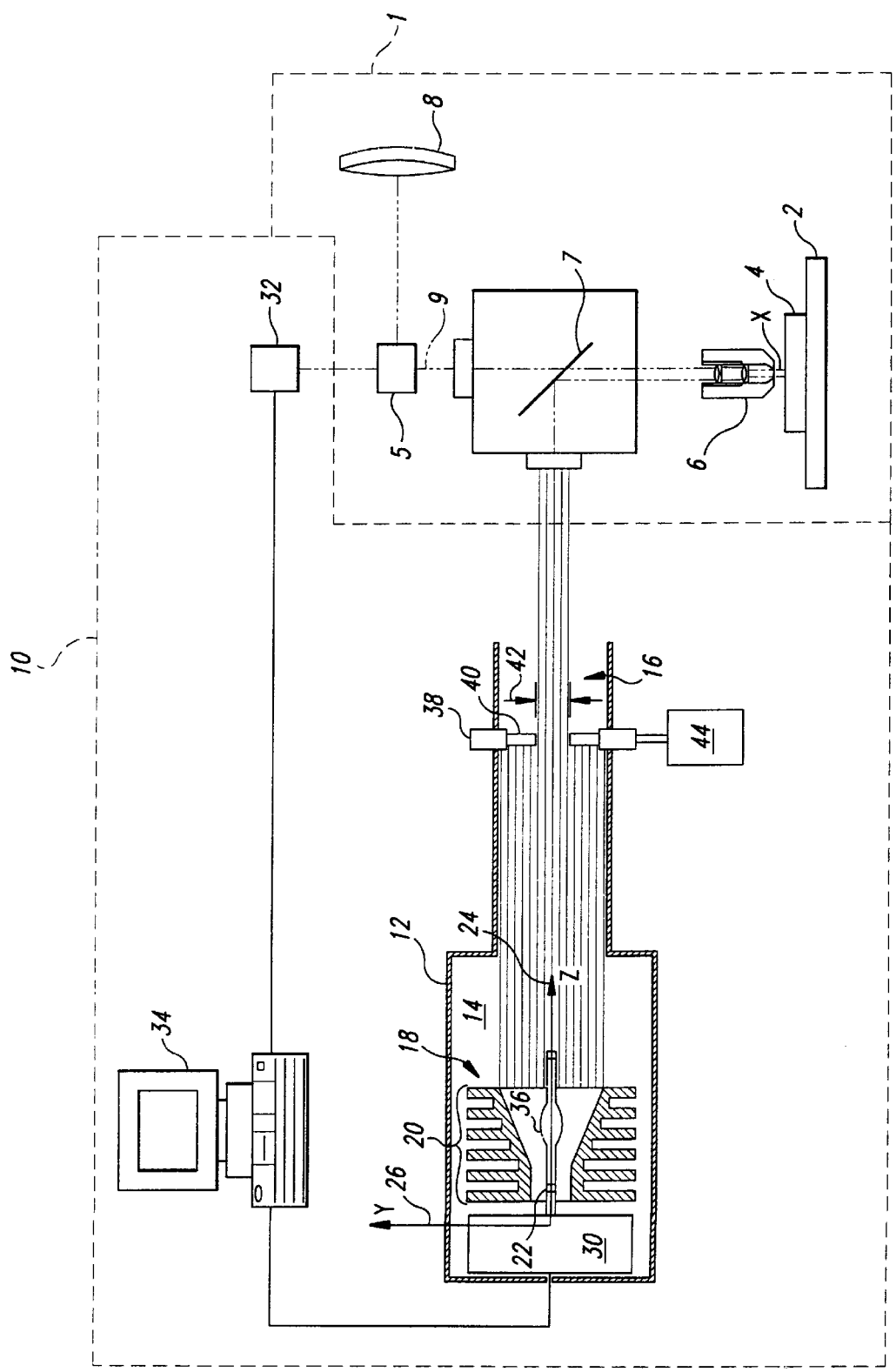
FIG. 1 is a side elevational view of an exemplary embodiment of the automated light tuner as used with a microscope.

With specific reference to FIG. 1, a first exemplary embodiment is shown in conjunction with a microscope 1. The microscope 1 has a stage 2 for holding an object or sample 4 to be illuminated, an objective 6 positioned immediately above the stage 2, an eyepiece lens 8 for cooperating with the objective 6 to magnify the sample 4. A mirror 7 is positioned between the objective 6 and the eyepiece lens 8 for reflecting light onto the sample 4 and for transmitting light reflected from the sample 4 through the objective 6 to the eyepiece lens 8 along a reflected light path 9. A trinocular head 5 may be positioned in the reflected light path 9 for diverting a portion of the reflected light to the eyepiece lens 8, a light meter 32 or some external device, such as a still or video camera (not shown). The microscope and its optics are conventional and well known.

Figure 2:
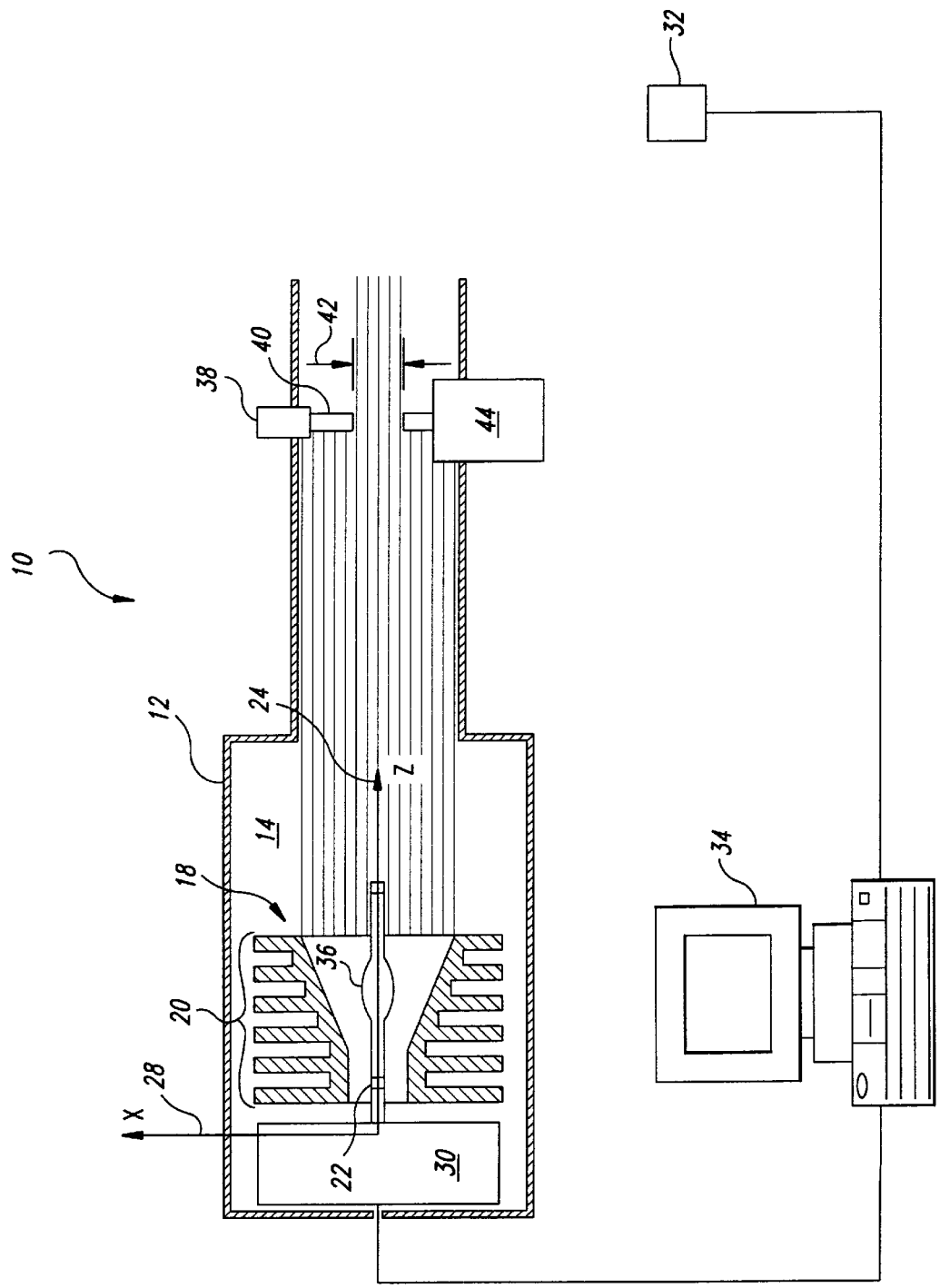
FIG. 2 is a top plan view of automated light tuner of FIG. 1 without the microscope.
Figure 6:
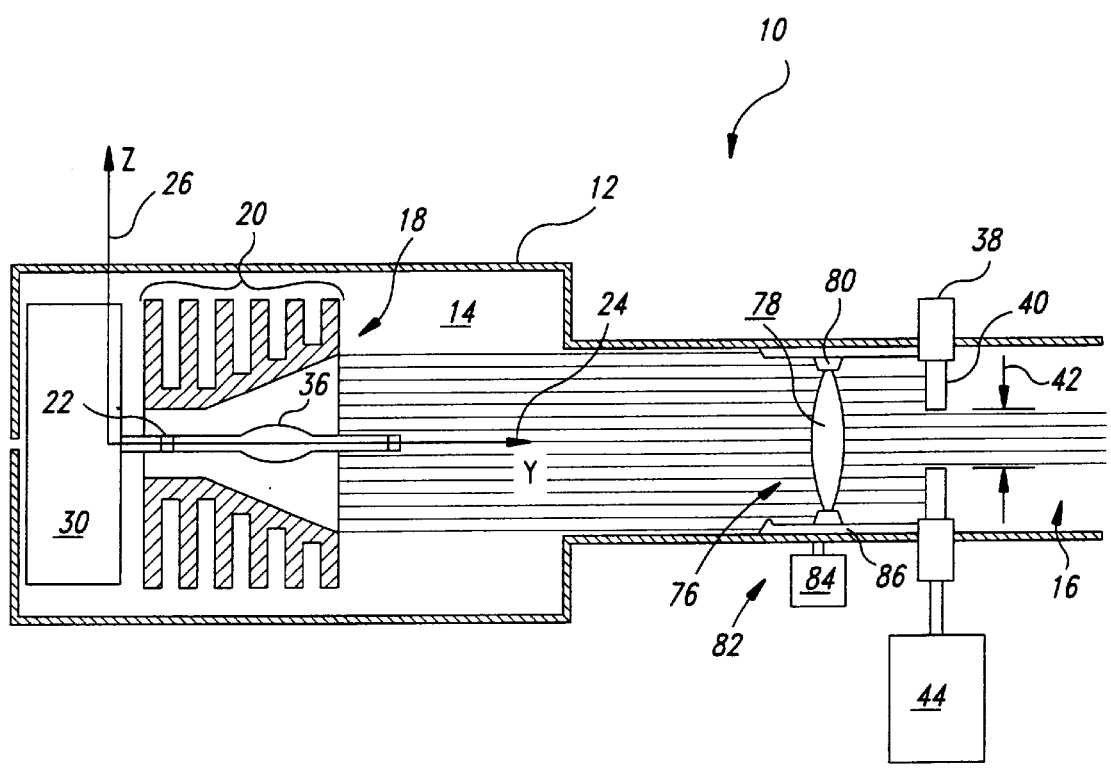
FIG. 6 is a top plan view of a second exemplary embodiment of the invention, including a lens and lens position drive mechanism.

With reference to FIGS. 1 and 2, the automated light tuner 10 includes a housing 12 defining an enclosure 14 having an opening 16 at one end. A reflector 18 is positioned within the enclosure 14. The reflector 18 may be a mirror, or any other reflector. A parabolic mirror is preferred as the reflector 18 since the point source from which light rays diverge may be positioned at the focal point of the reflector 18 to obtain a set of parallel rays reflected from the reflector 18, thus providing a collimated beam. A collimated beam may also be obtain by use of a collimator lens 78 (FIG. 6). The reflector 18 includes heat fins 20 to dissipate heat.

A light source receiver 22 is mounted in the enclosure 14 for movement with respect to the reflector 18. A light source 36 is mounted in the light source receiver 22 for movement therewith. The light source 36 may be mounted parallel to a major axis of the reflector 18, as shown, or may be mounted perpendicular to the major axis of the reflector 18. In the first exemplary embodiment, the light source receiver 22 is mounted for movement with respect to the reflector 18 along a first axis 24, a second axis 26 (FIG. 1) and a third axis 28 (FIG. 2), the first, second and third axes being orthogonal. This arrangement permits the light source to be selectively positioned in three dimensions. Other arrangements may be employed wherein the light source is selectively positionable in only one or two dimensions.

The automated light tuner 10 also includes a drive assembly 30 mounted in the enclosure for positioning the light source receiver 22 with respect to the reflector 18. The drive assembly 30 is responsive to a measurement of the intensity of light reflected from the sample 4 as detected by a light meter 32 positioned to sample light reflected along the reflected light path 9 from the sample 4. The light meter 32 may be composed of silicon diode sensor 33 (FIG. 3), positioned in the reflected light path 9, and a power meter 35 (FIG. 3) coupled to the sensor 33. The power meter 35 converts signals received from the sensor 33 into a numerical value which corresponds to the amount of light per unit time, or power, being reflected from the object 4. Use of a sensor having a fixed area ensures that the power measurement will be proportional to the intensity of light, light intensity being equal to the power per unit area. The light meter 32 may thus provide a measurement of the amount and the intensity of light in the form of a power signal.

With further reference to FIGS. 1 and 2, a control mechanism in the form of a programmed general purpose computer 34 controls the drive assembly 30 in response to the power and light intensity measurements provided by the light meter 32. While a programmed general purpose computer is shown in the first exemplary embodiment, a hard-wired circuit or microprocessor may be employed for controlling the drive assembly 30.

A diaphragm 38 is positioned across the opening 16 of the housing 12. The diaphragm 38 includes an aperture 40 having an adjustable size 42. The size 42 of the aperture 40 is selectively adjustable to control the amount of light provided to the sample 4 located on the stage 2 at the target position X. The size 42 of the aperture 40 is controlled by a drive mechanism.

Figure 3:
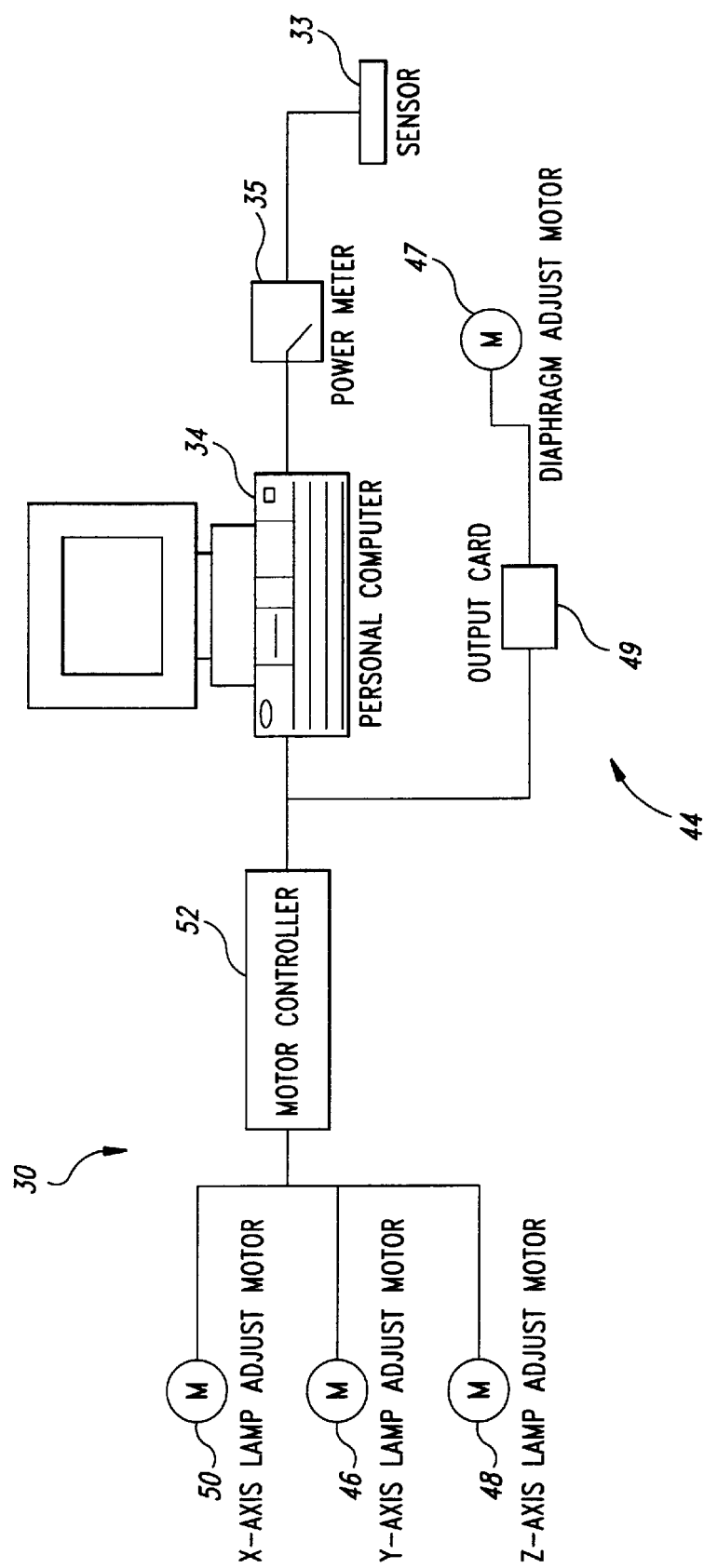
FIG. 3 is a schematic of the control mechanism and drive mechanism of the exemplary embodiment of FIG. 1.

With reference to FIG. 3, the drive assembly 30 is composed of a first motor 46, a second motor 48, and a third motor 50. The motors 46, 48, 50 are driven by a motor controller 52 that receives control signals from the computer 34. The motor controller 52 interprets a set of control signals from the computer 34 and drives the motors in accordance with the control signals. The aperture drive mechanism 44 is composed of an aperture motor 47 and an aperture motor controller 49, which in the exemplary embodiment takes the form of an output card. As can be seen in FIG. 3, the power meter 35 and sensor 33 provides power and light intensity measurements to the computer 34 in the form of the power signal. The computer 34 provides the control signals to the motor controller 52 for adjusting the position of the light source 36 in relation to the reflector 18 to achieve a maximum light intensity measurement at the target position X. The position of the light source receiver 22 and the light source 36 may be adjusted along each of the three axes 24, 26, 28 by the first, the second, and the third motors 46, 48, 50, respectively. Once the position of the light source 36 with respect to the reflector 18 has been adjusted to achieve a maximum light intensity, the aperture 40 of the diaphragm 38 may be adjusted to achieve a desired light intensity at the target position X.

The drive assembly 30 will be discussed in further detail with reference to FIGS. 4 and 5. The first motor 46 is connected to the light source receiver 22 (FIG. 5) by a first drive train 54. The first drive train 54 includes a threaded adjustment shaft 56 received in a threaded adjustment sleeve 58. The threaded adjustment sleeve 58 is slideably received in an aperture 59 formed in a first motor frame 60. The threaded adjustment sleeve 58 is connected to the light source receiver 22. Rotation of the threaded adjustment shaft 56 causes movement of the light source receiver 22 along the first axis 24.

The second motor 48 is connected to the light source receiver 22 by a second drive train 62. The second drive train 62 includes a threaded adjustment shaft 64 received in a threaded adjustment aperture 66 defined in the first motor frame 60. Rotation of the threaded adjustment shaft 64 causes movement of the light source receiver 22 along the second axis 26.

The third motor 50 (FIG. 5) is connected to the light source receiver 22 by a third drive train 68. The third drive train 68 includes a threaded adjustment shaft 70 received through a threaded adjustment aperture 72 defined in a support frame 74. Rotation of the threaded adjustment shaft 70 causes the light source receiver 22 to move along the third axis 28.

It should be noted that there are numerous ways of providing motorized drive linkages for moving the light source receiver 22 relative to the reflector 18 in one, two, and three dimensions.

With reference to FIG. 6, a second exemplary embodiment of the invention includes a lens assembly 76 including a lens 78, a lens holder 80 in which the lens 78 is mounted, and a lens position drive mechanism 82. The lens position drive mechanism 82 includes a lens position motor 84 and a lens position drive train 86. The lens position drive train 86 is shown as a rack and pinion in the exemplary embodiment. Other suitable drive mechanisms may be employed to move the lens 78 with respect to the light source 36 or reflector 18.

It will be appreciated that, although exemplary embodiments of the invention have been described above for purposes of illustration, various modifications may be made without deviating from the spirit and scope of the invention. For example, either the light source or the reflector or both may be positionable with respect to the housing, so long as there is relative movement between the light source and the reflector. Methods other than the reiterative process described for positioning the light source to achieve a maximum intensity can be employed. It should also be noted that while the exemplary embodiments have been discussed in light of a set of orthogonal axes in terms of Cartesian coordinates, other axes, such as a set for use with Polar coordinates could have been substituted without departing from the spirit of the invention. Therefore, the exemplary embodiments should not be construed to unduly limit the apparatus and methods which accomplish the purpose of automatically tuning a light source to achieve the uniform illumination of an object. Those skilled in the art will also appreciate that the structure and method taught in accordance with the present invention can be applied to other illumination devices. Indeed, numerous variations are well within the scope of the invention. Accordingly, the scope of the invention is not limited by the disclosure of particular embodiments, and terms used in the following claims should not be construed to limit the invention to these embodiments.

What is claimed is:

1. An automated light generator, comprising:
   a reflector;
   a light source receiver in which a light source is mounted, the light source receiver mounting the light source for relative movement with respect to the reflector in at least a first dimension;
   a light meter;
   a drive assembly coupled to the light source receiver to move the light source receiver along the first dimension in response to a control signal; and
   a control mechanism coupled to the light meter and the drive assembly to generate the control signal as a function of a power signal from the light meter.

2. The automated light generator of claim 1 wherein the light source receiver is mounted for movement with respect to the reflector in at least two dimensions, and the drive assembly is coupled to the light source receiver to move the light source receiver along the second dimension in response to the control signal.

3. The automated light generator of claim 1 wherein the light source receiver is mounted for movement with respect to the reflector in three dimensions, and the drive assembly is coupled to the light source receiver to move the light source receiver along the third dimension in response to the control signal.

4. The automated light generator of claim 1, further comprising:
   a diaphragm positioned between the light source receiver and a target position, the diaphragm having an aperture to control an amount of light passing therethrough.

5. The automated light generator of claim 4 wherein the aperture of the diaphragm is adjustable; and
   wherein the automated light generator further comprises:
      an aperture drive mechanism coupled to the aperture of the diaphragm to adjust a size of the aperture in response to the power signal from the light meter.

6. The automated light generator of claim 5 wherein the aperture drive mechanism comprises:
   an aperture motor; and
   an aperture motor controller coupled to the aperture motor and the control mechanism for driving the aperture motor in response to the control signal.

7. The automated light generator of claim 1 wherein the light meter is positioned to sample a reflected light path.

8. The automated light generator of claim 1 wherein the drive assembly comprises:
   a first motor, the first motor interconnected with the light source receiver through a first drive train to adjust a position of the light source receiver relative to the reflector in at least one dimension; and
   a motor controller, the motor controller in control communication with the first motor.

9. The automated light generator of claim 1 wherein the drive assembly comprises:
   a first motor, the first motor interconnected with the light source receiver through a first drive train to adjust a position of the light source receiver relative to the reflector in at least the first dimension;
   a second motor, the second motor interconnected with the light source receiver through a second drive train to adjust the position of the light source receiver relative to the reflector in at least a second dimension; and
   a motor controller, the motor controller in controlling communication with the first and the second motors.

10. The automated light generator of claim 1 wherein the drive assembly comprises:
a first motor, the first motor interconnected with the light source receiver through a first drive train to adjust a position of the light source receiver relative to the reflector in at least the first dimension;
a second motor, the second motor interconnected with the light source receiver through a second drive train to adjust the position of the light source receiver relative to the reflector in at least a second dimension;
a third motor, the third motor interconnected with the light source receiver through a third drive train to adjust the position of the light source receiver relative to the reflector in a third dimension; and
a motor controller, the motor controller in controlling communication with the first, the second and the third motors.

11. The automated light generator of claim 1, further comprising:
an optical lens, the optical lens selectively positionable between the light source receiver and the diaphragm.

12. The automated light generator of claim 1, further comprising:
an optical lens, the optical lens selectively positionable between the light source receiver and the diaphragm; and
a lens position drive mechanism, the lens position drive mechanism responsive to the control mechanism.

13. An automated light tuner comprising:
a housing defining an enclosure having an opening;
a reflector mounted in the enclosure of the housing;
a light source receiver, the light source receiver mounted in the enclosure of the housing for movement with respect to the reflector along at least a first axis;
a diaphragm located across the opening of the housing between the reflector and a target position, the diaphragm having an aperture to permit a controlled amount of light therethrough;
a light meter positioned to sample a reflected light path, to produce a power signal proportional to a light intensity detected by the light meter;
a control mechanism responsive to the power signal; and
a drive assembly coupled to the light source receiver to move the light source receiver in response to a control signal from the control mechanism.

14. The automated light tuner of claim 13, further comprising:
a light source mounted in the light source receiver.

15. The automated light tuner of claim 13 wherein
the light source receiver is mounted for movement with respect to the reflector along at least a second axis; and
the drive assembly is coupled to the light source receiver to move the light source receiver along at least the second axis in response to the control signal.

16. The automated light tuner of claim 13 wherein
the light source is mounted for movement with respect to the reflector along at least a second and a third axis;
the drive assembly is coupled to the light source receiver to move the light source receiver along at least the second axis and the third axis in response to the control signal from the control mechanism.

17. The automated light tuner of claim 13 wherein
the light source receiver is mounted with respect to the reflector for movement along and about a first axis and along a second axis;
the drive assembly is coupled to the light source receiver to move the light source receiver along and about the first axis and along the second axis in response to the control signal from the control mechanism.

18. The automated light tuner of claim 13 wherein
the aperture of the diaphragm has a size which is selectively adjustable; and
wherein the automated light tuner further comprises:
an aperture drive mechanism, the aperture drive mechanism coupled to the aperture to selectively adjust the size of the aperture in response to the control mechanism.

19. The automated light tuner of claim 13 wherein the drive assembly comprises:
a first motor, the first motor interconnected with the light source receiver and adapted to move the light source receiver with respect to the reflector along the first axis; and
a motor controller, the motor controller in control communication with the first motor.

20. The automated light tuner of claim 13 wherein the drive assembly comprises:
a first motor, the first motor interconnected with the light source receiver to move the light source receiver with respect to the reflector along the first axis;
a second motor, the second motor interconnected with the light source receiver to move the light source receiver with respect to the reflector along a second axis; and
a motor controller, the motor controller in controlling communication with the first and the second motors.

21. The automated light tuner of claim 13 wherein the light source movement mechanism comprises:
a first motor, the first motor interconnected with the light source receiver to move the light source receiver with respect to the reflector along the first axis;
a second motor, the second motor interconnected with the light source receiver to move the light source receiver with respect to the reflector along a second axis;
a third motor, the third motor interconnected with the light source receiver to move the light source receiver with respect to the reflector along a third axis; and
a motor controller, the motor controller in controlling communication with the first, the second and the third motors.

22. The automated light tuner of claim 13 wherein the control mechanism comprises:
a programmed general purpose computer.

23. The automated light tuner of claim 13, further comprising:
an optical lens, the optical lens selectively positionable between the light source receiver and the diaphragm.

24. The automated light tuner of claim 13, further comprising:
an optical lens, the optical lens selectively positionable between the light source receiver and the diaphragm; and
a lens position drive mechanism, the lens position drive mechanism responsive to the control mechanism and coupled to the optical lens to move the optical lens along at least a second axis.

25. A method of automatically tuning a light from a light source, the method comprising the steps of:
adjusting a relative position of the light source with respect a reflector along a first axis to achieve a first maximum light intensity proximate a target position; and
adjusting an aperture of a diaphragm positioned between the light source and the target position to achieve a desired amount of light proximate the target position.

26. The method of claim 25, further comprising the step of:
    adjusting the relative position of the light source with respect to the reflector along a second axis to achieve a second maximum light intensity.

27. The method of claim 25, further comprising the step of:
    adjusting the relative position of the light source with respect to the reflector along a second axis to achieve a second maximum light intensity; and
    adjusting the relative position of the light source with respect to the reflector along a third axis to achieve a third maximum light intensity.

28. The method of claim 27 wherein:
    the steps of adjusting the relative position of the light source with respect the reflector along a first, a second and a third axis are performed before the step of adjusting the aperture of the diaphragm.

29. A method of tuning a light source for illuminating an object, the method comprising the steps of:
    providing a light from a light source to the object;
    measuring an intensity of light in a path of light reflected from the object; and
    automatically adjusting a position of the light source with respect a reflector along a first axis until the measured intensity of light reaches a first maximum intensity of light.

30. The method of claim 29, further comprising the step of:
    automatically adjusting the position of the light source with respect to the reflector along a second axis until the measured intensity of light reaches a second maximum intensity of light.

31. The method of claim 30, further comprising the step of:
    automatically adjusting an aperture of a diaphragm until a desired amount of light is supplied to the object.

32. The method of claim 31, further comprising the step of:
    automatically adjusting the position of the light source with respect to the reflector along a third axis until the measured intensity of light reaches a third maximum intensity of light.

33. The method of claim 32 wherein the step of adjusting the aperture of the diaphragm is performed after the steps of automatically adjusting the position of the light source with respect to the first axis, the second axis and the third axis.

34. The method of claim 29 wherein the method of automatically adjusting a position of the light source with respect to a reflector along a first axis comprises the steps of:
    measuring the intensity of light at a first position
    moving the light source in a first direction along the first axis from the first position to a second position;
    measuring the intensity of light at the second position;
    comparing the intensity of light measured at the first position with the intensity of light measured at the second position;
    moving the light source in the first direction along the first axis if the intensity of light measured at the first position is less than the intensity of light measured at the second position; and
    moving the light source in a second direction along the first axis, opposite to the first direction, if the intensity of light measured at the first position is greater than the intensity of light measured at the second position.

35. The method of claim 29 wherein the method of automatically adjusting a position of the light source with respect to a reflector along a first axis comprises the steps of:
    measuring the intensity of light at a first position
    moving the light source a first step size in a first direction along the first axis from the first position to a second position;
    measuring the intensity of light at the second position;
    comparing the intensity of light measured at the first position with the intensity of light measured at the second position;
    moving the light source the first step size in the first direction along the first axis if the intensity of light measured at the first position is less than the intensity of light measured at the second position; and
    moving the light source a second step size, the second step size being smaller than the first step size, in a second direction along the first axis, opposite to the first direction, if the intensity of light measured at the first position is greater than the intensity of light measured at the second position.

36. The method of claim 29 wherein the method of automatically adjusting a position of the light source with respect to a reflector along a first axis comprises the steps of:
    measuring the intensity of light at a prior position;
    successively moving the light source a first step size in a first direction along the first axis from a prior position to a subsequent position until the intensity of light at the prior position is greater than the intensity of light at the subsequent position;
    measuring the intensity of light at each successive subsequent position; and
    comparing the intensity of light measured at the prior position with the intensity of light measured at the subsequent position.

37. A method for automatically adjusting a light source for providing a desired illumination of an object, the method comprising the steps of:
    illuminating the object with a light from the light source;
    measuring the power of the light reflected from the object; and
    automatically adjusting a position of the light source relative to a reflector in response to the control signal.

38. The method of claim 37 wherein the step of automatically adjusting the position of the light source relative to a reflector comprises the steps of:
    generating a power signal which corresponds to the measured power and which is proportional to the intensity of the light;
    providing the power signal to a control mechanism;
    generating a control signal in response to the power signal;
    operating a first motor according to the control signal to position the light source along a first axis with respect to the reflector.

39. The method of claim 38 wherein the step of automatically adjusting the position of the light source relative to a reflector further comprises the step of:
    operating a second motor according to the control signal to position the light source along a second axis with respect to the reflector.

40. The method of claim 39 wherein the step of automatically adjusting the position of the light source relative to a reflector further comprises the step of:
    operating a third motor according to the control signal to position the light source along a third axis with respect to the reflector.

* * * * *